US 10,944,393 B2

(12) United States Patent
Terashima

(10) Patent No.: US 10,944,393 B2
(45) Date of Patent: Mar. 9, 2021

(54) DRIVE DEVICE FOR SEMICONDUCTOR ELEMENT

(71) Applicant: Fuji Electric Co., Ltd., Kanagawa (JP)

(72) Inventor: Kenshi Terashima, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 407 days.

(21) Appl. No.: 15/918,727

(22) Filed: Mar. 12, 2018

(65) Prior Publication Data

US 2018/0269867 A1    Sep. 20, 2018

(30) Foreign Application Priority Data

Mar. 16, 2017   (JP) .............................. JP2017-051971

(51) Int. Cl.
| | |
|---|---|
| *H02H 7/00* | (2006.01) |
| *H03K 17/14* | (2006.01) |
| *H03K 17/78* | (2006.01) |
| *H03K 17/082* | (2006.01) |
| *H03K 17/08* | (2006.01) |

(52) U.S. Cl.
CPC ......... *H03K 17/14* (2013.01); *H03K 17/0828* (2013.01); *H03K 17/78* (2013.01); *H03K 2017/0806* (2013.01)

(58) Field of Classification Search
None
See application file for complete search history.

(56) References Cited

U.S. PATENT DOCUMENTS

| | | | | |
|---|---|---|---|---|
| 7,607,827 | B2 * | 10/2009 | Karikomi | ............... G01K 7/425 |
| | | | | 361/93.8 |
| 8,717,068 | B2 * | 5/2014 | Wasekura | .......... H03K 17/6877 |
| | | | | 327/108 |
| 8,970,259 | B2 | 3/2015 | Mori | |

(Continued)

FOREIGN PATENT DOCUMENTS

| | | |
|---|---|---|
| CN | 1670497 A | 9/2005 |
| EP | 2 991 217 A1 | 3/2016 |
| JP | 2008-236994 A | 10/2008 |

(Continued)

OTHER PUBLICATIONS

Japanese Office Action dated Dec. 8, 2020 in a counterpart Japanese patent application No. 2017-051971. (A machine translation (not reviewed for accuracy) attached.).

(Continued)

*Primary Examiner* — Stephen W Jackson
(74) *Attorney, Agent, or Firm* — Chen Yoshimura LLP

(57) ABSTRACT

A drive device for a semiconductor element includes a drive circuit receiving from outside a pulsed drive signal for driving ON/OFF of the semiconductor element; and a protection circuit receiving a signal representing a chip temperature of the semiconductor element and, when the detected chip temperature exceeds an overheating threshold temperature, controlling operation of the drive circuit so as to adjust a drive control voltage that is provided to the semiconductor element; and a drive information output circuit externally outputting drive information corresponding to the adjusted drive control voltage that is provided to the semiconductor element by the drive circuit.

7 Claims, 5 Drawing Sheets

(56) References Cited

U.S. PATENT DOCUMENTS

2005/0204761 A1 9/2005 Karikomi et al.
2015/0180227 A1 6/2015 Sekigawa

FOREIGN PATENT DOCUMENTS

| JP | 2013-219633 A | 10/2013 |
| JP | 2013-258858 A | 12/2013 |
| JP | 2014-103820 A | 6/2014 |
| WO | 2014/174651 A1 | 10/2014 |

OTHER PUBLICATIONS

Chinese Office Action dated Dec. 4, 2020 in a counterpart Chinese patent application No. 201810136035.6.

* cited by examiner

DRIVE DEVICE FOR SEMICONDUCTOR ELEMENT

BACKGROUND OF THE INVENTION

Technical Field

The present invention relates to a drive device for a semiconductor element capable of accurately externally outputting information that indicates a drive state corresponding to a chip temperature of the semiconductor element.

Background Art

A drive device for a semiconductor element, which forms a power conversion device such as an inverter, functions to drive ON/OFF of a semiconductor element such as an insulated gate bipolar transistor (IGBT) to perform power conversion. There has been particular interest lately in so-called intelligent power modules (IPMs) as drive devices for semiconductor elements. An IPM includes, for example, an IGBT and a drive circuit therefor, and in addition, a protection circuit to prevent destruction of the IGBT etc. due to overcurrent, overvoltage, overheating, or the like, all of which are modularized as a single electronic component in the IPM.

FIG. 4 is a view of a schematic configuration showing the main part of one example of a power conversion device 1; reference character 2 is an IPM primarily constituted by an IGBT (semiconductor element) 3 and a control IC 4, which is a drive circuit for the IGBT. The specific configuration of the IPM 2 will be described later with reference to FIG. 5. The power conversion device 1 includes a PWM signal generation circuit 5 that generates a pulse signal (PWM signal) for ON/OFF driving of the IGBT 3. In essence, the PWM signal generation circuit 5 generates a pulse width modulation signal (PWM signal) in accordance with a duty set by a PWM signal duty setting unit 6, which sets the duty on the basis of an output power specification instructed by a host device (not shown).

The PWM signal generated by the PWM signal generation circuit 5 is given to the IPM 2 via a first photocoupler 7a as a drive signal Vin for the IGBT 3. The control IC 4 in the IPM 2 generates a drive control signal OUT to be applied to the gate of the IGBT 3 in accordance with the drive signal Vin and performs ON/OFF driving of the IGBT 3. Power conversion is performed in this manner by the ON/OFF driving of the IGBT 3.

The control IC 4 in the IPM 2 further includes a protection circuit, which will be described later. The protection circuit basically monitors current flowing to the IGBT 3 through a current detection emitter of the IGBT 3 and also monitors chip temperature of the IGBT 3 through a temperature detection diode 8 provided next to the IGBT 3. The protection circuit detects abnormalities such as overcurrent or overheating of the IGBT 3 in accordance with the monitoring information, and when an abnormality is detected, the protection circuit prevents destruction of the IGBT 3 by, for example, modifying the drive conditions of the IGBT 3.

Moreover, the control IC 4 in the IPM 2 externally outputs various types of abnormality detection information detected by the protection circuit via a second photocoupler 7b. A detection circuit 9 detects the information output from the IPM 2 in this manner and controls the PWM signal duty setting unit 6, and, for example, stops the generation of the PWM signal by the PWM signal generation circuit 5 or modifies the duty of the PWM signal generated by the PWM signal generation circuit 5. Stopping the generation of PWM signals in this manner stops the ON/OFF driving of the IGBT 3 and thus prevents thermal destruction of the IGBT 3 caused by overcurrent, overheating, or the like. Furthermore, controlling the duty of the PWM signals modifies the power conversion specification of the IGBT 3, or more specifically, the drive capability of the IGBT 3, which suppresses an increase in the chip temperature of the IGBT 3.

Patent Document 1, for example, describes in detail a technique for externally outputting, in a manner identifiable from outside (host device), abnormality detection information that contains abnormalities such as overcurrent, overvoltage, and overheating of the IGBT 3 detected by the protection circuit of the control IC 4.

One of the functions of the protection circuit is a drive capability switching function that switches the drive capability of the IGBT 3 in accordance with the chip temperature of the IGBT 3, regardless of command (instruction) from the host device. For example, the voltage change characteristics [dV/dt] during turn-on of the IGBT 3 decrease following the increase in chip temperature of the IGBT 3. Thus, there is an increase in switching loss of the IGBT 3 during turn-on due to the reduction in the voltage change characteristics [dV/dt] of the IGBT 3 associated with the increase in chip temperature. The drive capability switching function is a protective function that reduces the drive capability of the IGBT 3 by lowering the gate voltage applied to the IGBT 3 under internal control of the control IC 4 when the chip temperature of the IGBT 3 rises. The reduction control of the drive capability prevents a further increase in the chip temperature associated with increases in switching loss, and by extension, prevents destruction of the IGBT 3 due to overheating.

FIG. 5 is a view showing a schematic configuration of the main part of the protection circuit where the drive capability switching function is shown. The protection circuit is basically constituted by an overheat detection comparator 11, a logic circuit 12, and an IGBT drive circuit 15. The overheat detection comparator 11 detects overheating of the IGBT 3 by comparing a temperature detection voltage Vtemp indicating the chip temperature of the IGBT 3 detected by the diode 8 with an overheat detection reference voltage Voh set in advance. The logic circuit 12 switches the output to the IGBT drive circuit 15 on the basis of the output of the overheat detection comparator 11. With this configuration, the drive capability of the IGBT 3 is modified in accordance with the overheat detection state.

Specifically, the drive signals (PWM signals) Vin input to the logic circuit 12 is output from the logic circuit 12 as one of signal voltages Va, Vb, and Vc of three systems, for example. The signal voltages Va, Vb, and Vc selectively drive ON switching devices 14a, 14b, and 14c respectively connected to a plurality of voltage dividing points in a resistor voltage dividing circuit 13 in which a plurality of resistors are connected in series. As a result, one of three types of drive signals (PWM signals) Vref1, Vref2, and Vref3 with differing voltage levels and divided by the resistor voltage dividing circuit 13 is selectively output through the switching devices 14a, 14b, or 14c, respectively.

The IGBT drive circuit 15 receives the drive signals (PWM signals) Vref1, Vref2, and Vref3 with the differing voltage levels which are selectively switched in the aforementioned manner, and generates a drive control signal OUT based on the voltage level. Modification of the voltage level of the drive control signal OUT modifies the drive control voltage (gate voltage) applied to the gate of the IGBT 3, thus changing the drive capability of the IGBT 3.

Specifically, the IGBT drive circuit 15 modifies the drive control voltage applied to the gate of the IGBT 3 in accordance with the voltage level of the drive signal Vref. Modifying the drive control voltage controls the charging current for the gate of the IGBT 3. This results in the charging current for the gate of the IGBT 3 being suppressed in accordance with a reduction in the voltage change characteristics [dV/dt] of the IGBT 3 associated with an increase in chip temperature. Thus, this prevents an increase in switching loss during turn-ON of the IGBT 3, and by extension, suppresses an increase in chip temperature.

RELATED ART DOCUMENT

Patent Document

Patent Document 1: Japanese Patent Application Laid-Open Publication No. 2013-258858

SUMMARY OF THE INVENTION

The modification of drive capability of the IGBT 3 based on the chip temperature as described above is a protective operation performed internally in the IPM 2. In other words, the modification control of the drive capability of the IGBT 3 is performed independently of the ON/OFF driving of the IGBT 3 with the duty determined in accordance with the output power specification instructed by the host device. Therefore, when the chip temperature increases and the drive capability of the IGBT 3 is internally modified in the IPM 2, this suppresses a rise in the chip temperature, and thus the aforementioned overheating abnormality is not detected any more.

Moreover, regardless of the protective operation of modifying the drive capability of the IGBT 3 as described above, if the chip temperature continues to increase and an overheating abnormality is detected, the ON/OFF driving of the IGBT 3 is controlled to stop and abnormality detection information is externally output from the IPM 2 following such detection. Accordingly, detection of overheating abnormalities of the IGBT 3 in the host device is possible only when the abnormality detection information has been output from the IPM 2.

Furthermore, the duty of the PWM signal for ON/OFF driving of the IGBT 3 is set by solely assuming that the IPM 2 operates exclusively within an ordinary chip temperature range and that the drive capability of the IGBT 3 is always constant. If the drive capability of the IGBT 3 is modified in accordance with the chip temperature under control of the protection circuit in such operation conditions, there is a possibility that the output power of the power conversion device 1 changes following this. However, the aforementioned abnormality detection information is merely output from the IPM 2, and thus it is impossible to ascertain the reason for the change in output power of the power conversion device 1 in the host device that designates the output power of the power conversion device 1.

The present invention was made in consideration of such a situation and aims at providing a drive device for a semiconductor element capable of accurately externally outputting information that indicates a drive state of the semiconductor element, in particular, the modification of the drive capability of the IGBT due to the chip temperature.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a drive device for a semiconductor element, including: a drive circuit receiving from outside a pulsed drive signal for driving ON/OFF of the semiconductor element; and a protection circuit receiving a signal representing a chip temperature of the semiconductor element and, when the detected chip temperature exceeds an overheating threshold temperature, adjusting a drive control voltage that is provided to the semiconductor element so as to control operation of the drive circuit; and a drive information output circuit externally outputting drive information in accordance with the adjusted drive control voltage that is provided to the semiconductor element by the drive circuit.

In the above drive device, the drive information output circuit may output the drive information in the form of a pulse train signal that has a pulse height and a pulse period both of which are determined in accordance with the adjusted drive control voltage.

In the above drive device, the drive information output circuit may generate, as the drive information, a pulse train signal, for example, such that a product of a pulse height of the pulse train signal and a pulse period of the pulse train signal indicates a drive capability of the semiconductor element.

In the above drive device, the semiconductor element may be an IGBT, for example, and the adjustment of the drive control voltage of the semiconductor element may be performed by switching a voltage provided to the drive circuit in accordance with the detected chip temperature of the IGBT.

The above drive device may further include a display unit that indicates the adjustment of the drive control voltage.

The drive device for the semiconductor element with the aforementioned configuration makes it possible to prevent an increase in switching loss by lowering the drive capability of the semiconductor element (IGBT) following an increase in the chip temperature of the semiconductor element (IGBT) in the protection circuit. When the drive capability of the semiconductor element (IGBT) has been modified in accordance with the chip temperature under control of the protection circuit, operation state information indicating the drive capability of the semiconductor element (IGBT) is output to the host device. As a result, in the host device, it is possible not only to detect an abnormality in the semiconductor element from the abnormality detection information output from the drive device, but also to easily ascertain the modification of the drive capability of the semiconductor element by the internal control of the drive device.

In particular, it is possible to accurately ascertain the modified drive capability of the semiconductor element that has been modified in accordance with the chip temperature of the semiconductor element while also ascertaining the drive capability of the semiconductor element that is externally defined in accordance with a product of the level of the drive information signal corresponding to the voltage level of the drive control signal applied to the gate of the semiconductor element and the pulse width of the drive control signal. Furthermore, the drive capability itself of the semiconductor element controlled by the protection circuit can be ascertained from either the level of the drive information signal or the pulse width of the drive control signal.

It is to be understood that both the foregoing general description and the following detailed description are exemplary and explanatory, and are intended to provide further explanation of the invention as claimed.

DETAILED DESCRIPTION OF EMBODIMENTS

A drive device for a semiconductor element according to one embodiment of the present disclosure will be described below with reference to the drawings.

Figure 1:
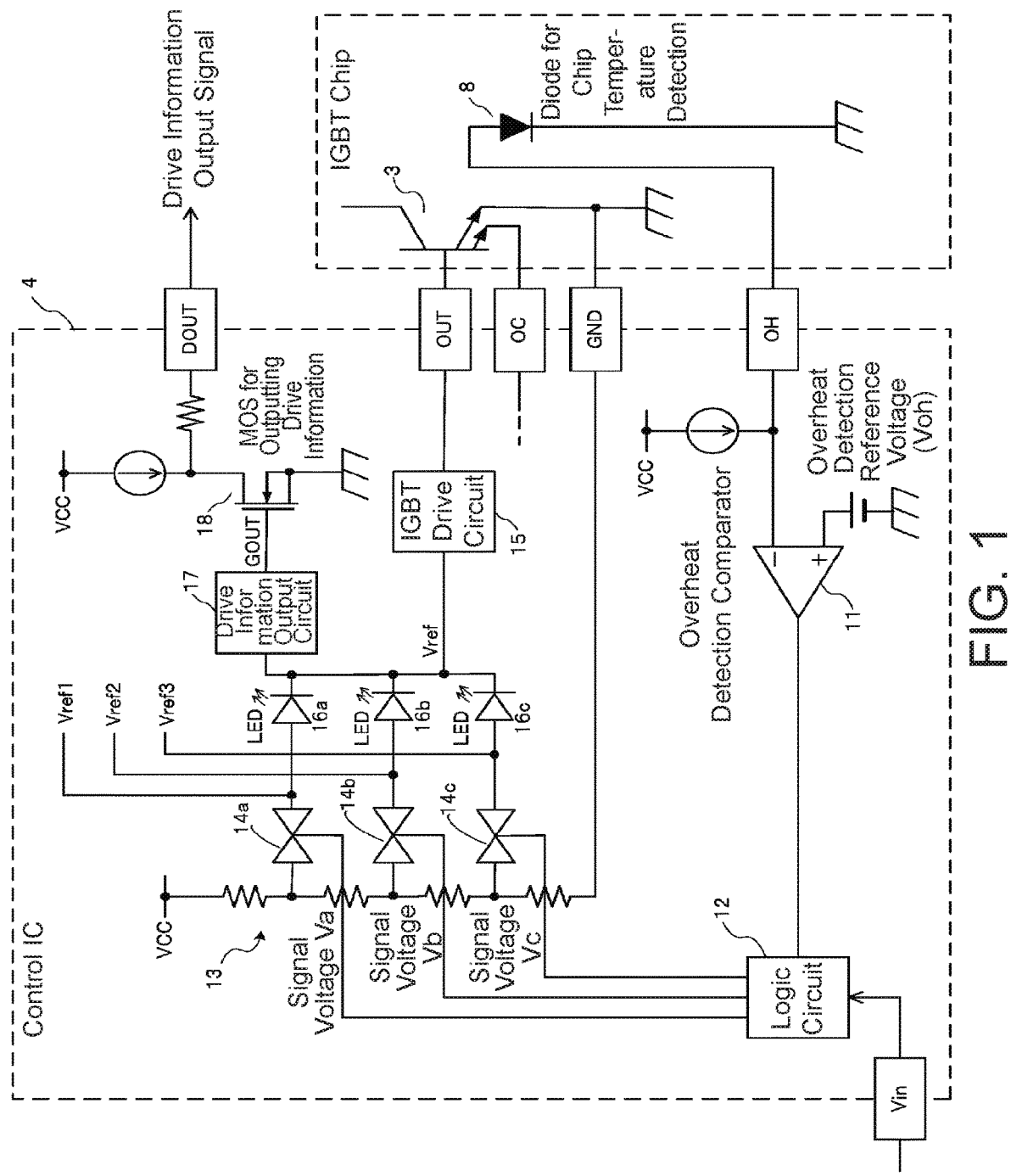
FIG. 1 is a view of a schematic configuration of the main part of a drive device for a semiconductor element in one embodiment of the present invention.
Figure 5:
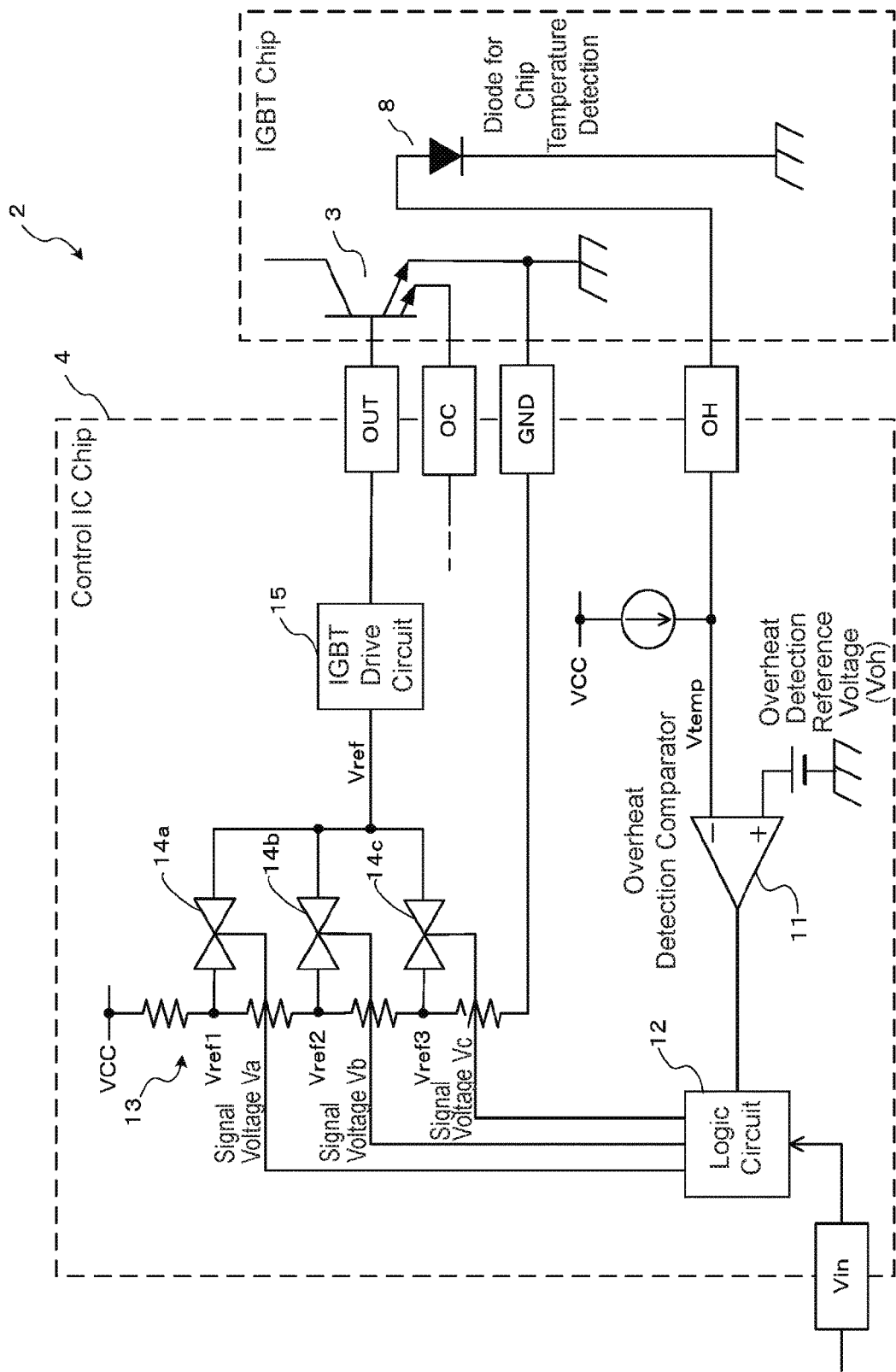
FIG. 5 is a schematic configuration of the main part of a drive device for a semiconductor element shown without the IGBT drive capability switching function in the power conversion device shown in FIG. 4.

FIG. 1 is a view of a schematic configuration of the main part of an IPM 2, which is the drive device for the semiconductor element in one embodiment of the present invention. Similar to the IPM 2 shown in FIG. 5, the IPM (drive device) 2 is mainly constituted by an IGBT 3, which is a semiconductor element for power conversion, and a control IC 4, which is a drive circuit for the semiconductor element. The same reference characters will be given to the parts that are the same as the configuration of the IPM 2 shown in FIG. 5, and redundant explanations of such parts will be omitted. The IGBT 3 is provided with a diode 8 for chip temperature detection to form a chip, and the drive circuit of the IGBT 3, the overheat detection comparator 11 and logic circuit 12 described above, the IGBT drive circuit 15, and the like are formed as a chip in the control IC 4.

The IPM 2 includes, as one function of the protection circuit for the IGBT 3, a drive capability switching function to switch the drive capability of the IGBT 3 in accordance with the chip temperature of the IGBT 3 which is detected via the diode 8. The drive capability switching function is basically constituted by the overheat detection comparator 11 that determines the chip temperature of the IGBT 3 as described above, the logic circuit 12, the resistor voltage dividing circuit 13, and the switching devices 14a, 14b, 14c.

The logic circuit 12 receives from outside (from a host device) a pulse drive signal Vin that defines the drive capability of the semiconductor element and selectively outputs one of signal voltages Va, Vb, or Vc of three systems based on the drive signal Vin in accordance with the output of the overheat detection comparator 11. The resistor voltage dividing circuit 13 generates three types of voltages with differing levels by resistively dividing a power supply voltage Vcc. The switching devices 14a, 14b, and 14c are respectively connected to resistor voltage dividing points in the resistor voltage dividing circuit 13, and the switching devices are selectively driven ON/OFF by the signal voltages Va, Vb, and Vc output from the logic circuit 12.

Due to the drive capability switching function being constituted in this manner, the drive signals (PWM signals) Vref given to the IGBT drive circuit 15 under control of the logic circuit 12 are alternately switched among three types of drive signals Vref1, Vref2, and Vref3 with differing voltages.

In addition to such a configuration, the IPM 2 of the present disclosure includes display units 16a, 16b, and 16c connected in series to the respective switching devices 14a, 14b, and 14c. These display units 16a, 16b, and 16c are LEDs that emit differing colors of light, for example, and selectively emit light in conjunction with the alternating conductance of the switching devices 14a, 14b, and 14c.

The IPM 2 also includes a drive information output circuit 17 that receives one of the three types of signals Vref1, Vref2, and Vref3 having differing voltage levels that are alternately output via the switching devices 14a, 14b, and 14c, and also receives the drive signal (PWM signal) Vref given to the IGBT drive circuit 15. The drive information output circuit 17 generates a pulse signal (pulse train signal) GOUT having a pulse height corresponding to the voltage level Vref1, Vref2, or Vref3 that is provided as the drive signal (PWM signal) Vref with a pulse period corresponding to the voltage level Vref1, Vref2, or Vref3. The generation of the aforementioned pulse train signal by the drive information output circuit 17 will be described later. The pulse train signal generated by the drive information output circuit 17 is applied to the gate of a MOS-FET 18 for outputting drive information, and the ON/OFF of the MOS-FET 18 generates the drive information output signal and externally outputs the signal. In this disclosure, the drive information output circuit 17, the MOS-FET 18 and other elements connected to the MOS-FET 18 depicted in FIG. 1 may also be collectively referred to as a drive information output circuit that outputs a drive information output signal DOUT to the exterior.

Figure 2:
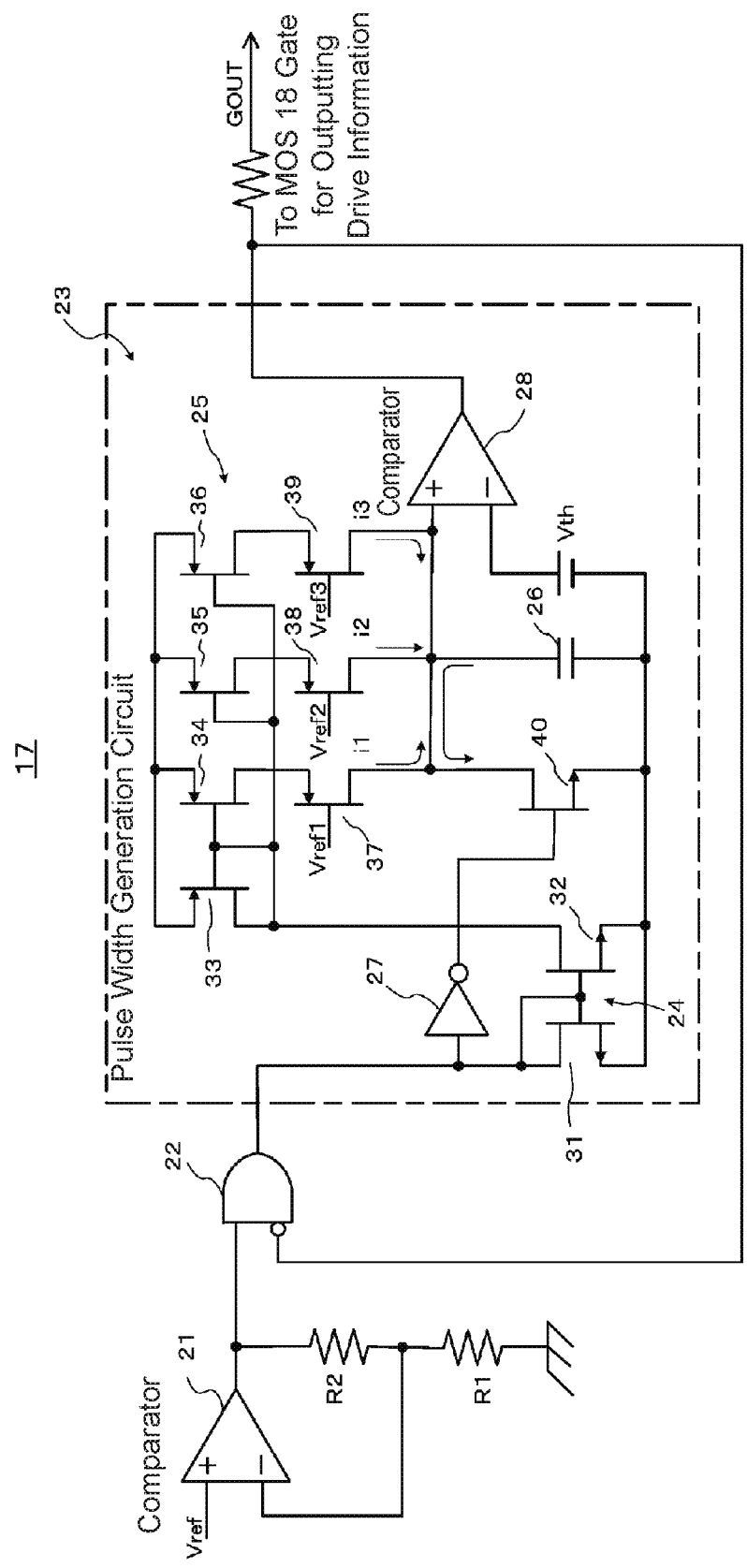
FIG. 2 is a view showing a configuration example of a drive information output circuit in the drive device for the semiconductor element shown in FIG. 1.

FIG. 2 is a configuration example of the drive information output circuit 17. The drive information output circuit 17 includes a comparator 21 at the input stage of the drive signal (PWM signal) Vref given to the IGBT drive circuit 15. The comparator 21 detects changes in the voltage level of the drive signal (PWM signal) Vref by comparing the drive signal (PWM signal) Vref with a comparison reference voltage generated via the output voltage of the comparator 21 being divided by resistors R1 and R2 connected in series. An AND circuit 22 logically processes the output of the comparator 21 and the output of a pulse width generation circuit 23 to generate a trigger signal that starts up the pulse width generation circuit 23.

The pulse width generation circuit 23 includes a first current mirror circuit 24 that receives the output from the AND circuit 22 at the input stage thereof and outputs a current that is proportional to the output current of the AND circuit 22 from an n-type FET 32. The first current mirror 24 is made of a pair of n-type FETs 31 and 32. A second current mirror circuit 25 of three groups constituted by p-type FETs 33, 34, 35, and 36 is connected to the n-type FET 32 on the current output side of the first current mirror circuit 24. The second current mirror circuit 25 respectively outputs mutually differing currents i1, i2, and i3, which are proportional to the output current of the first current mirror 24, from p-type FETs 34, 35, and 36.

Furthermore, the currents i1, i2, and i3 respectively output from the p-type FETs 34, 35, and 36 are supplied as charging currents to a capacitor 26 via respective n-type FETs 37, 38, and 39, which are switches. Accordingly, the capacitor 26 is charged by the selectively supplied currents i1, i2, or i3 with a mutually differing charging characteristic. An n-type FET 40 is connected in parallel to the capacitor 26. The n-type FET 40 turns ON by receiving the output of the AND circuit 22 via an inversion circuit 27 and functions to discharge the charge in the capacitor 26 to reset the charging voltage of the capacitor 26 to zero (0V).

Specifically, when the drive signal (PWM signal) Vref becomes H level, the capacitor 26 is charged with a current i1, i2, or i3 corresponding to the voltage level of the drive signal Vref1, Vref2, or Vref3 at that time, and when the drive signal (PWM signal) Vref becomes L level, the charge in the capacitor 26 is discharged. A comparator 28 generates a pulse train signal GOUT having a pulse width (pulse period) corresponding to the voltage level of the drive signal Vref1, Vref2, or Vref3 at a voltage level corresponding to the voltage level of the drive signal Vref1, Vref2, or Vref3 by comparing changes in the charging voltage associated with the charging/discharging of the capacitor 26 described above with a prescribed reference voltage Vth. The drive information is inverted by the MOS-FET 18 described above and is externally output as a drive information output signal DOUT.

Figure 3:
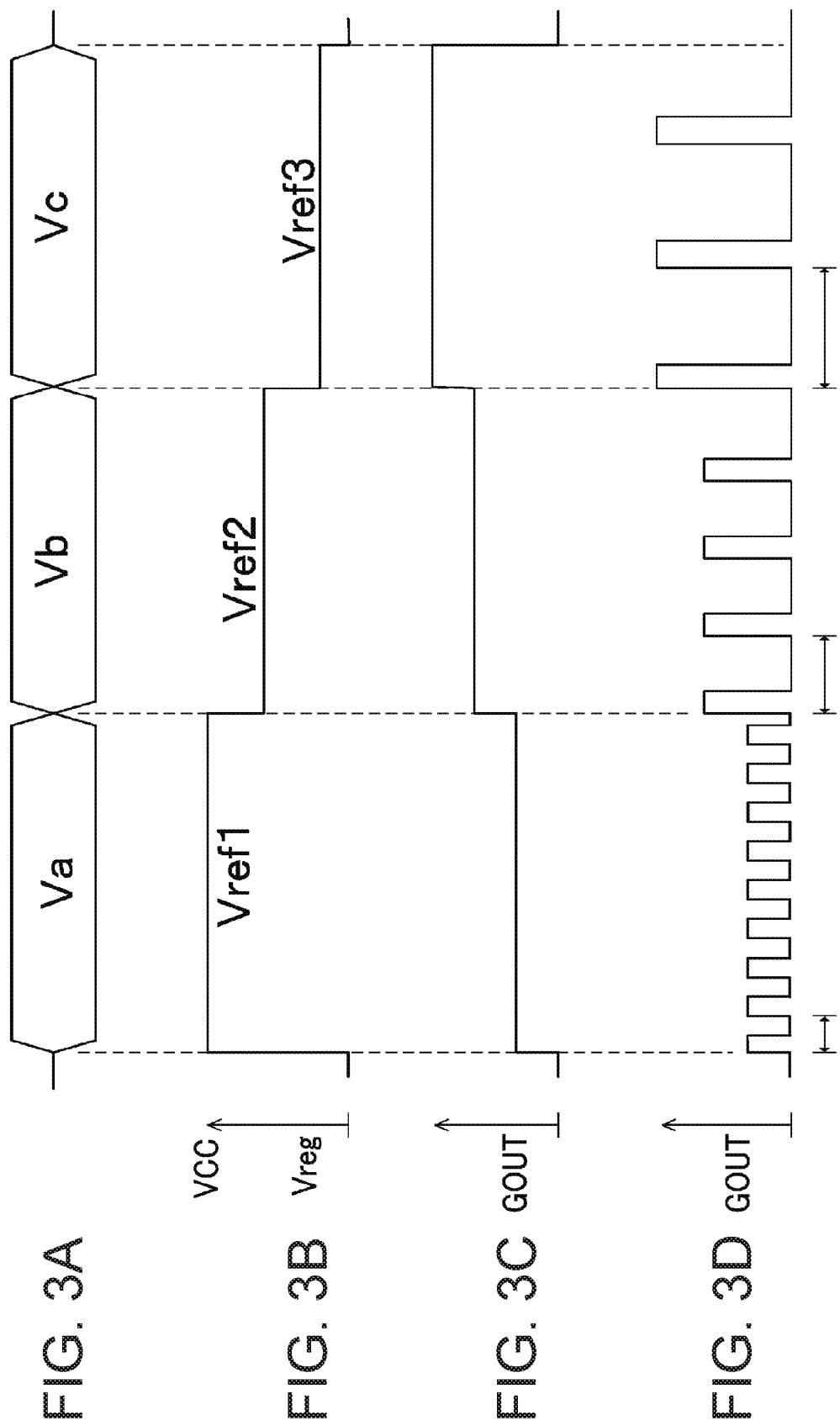
FIGS. 3A-3D are operation waveform diagrams showing the effects of the drive information output circuit shown in FIG. 2.
Figure 4:
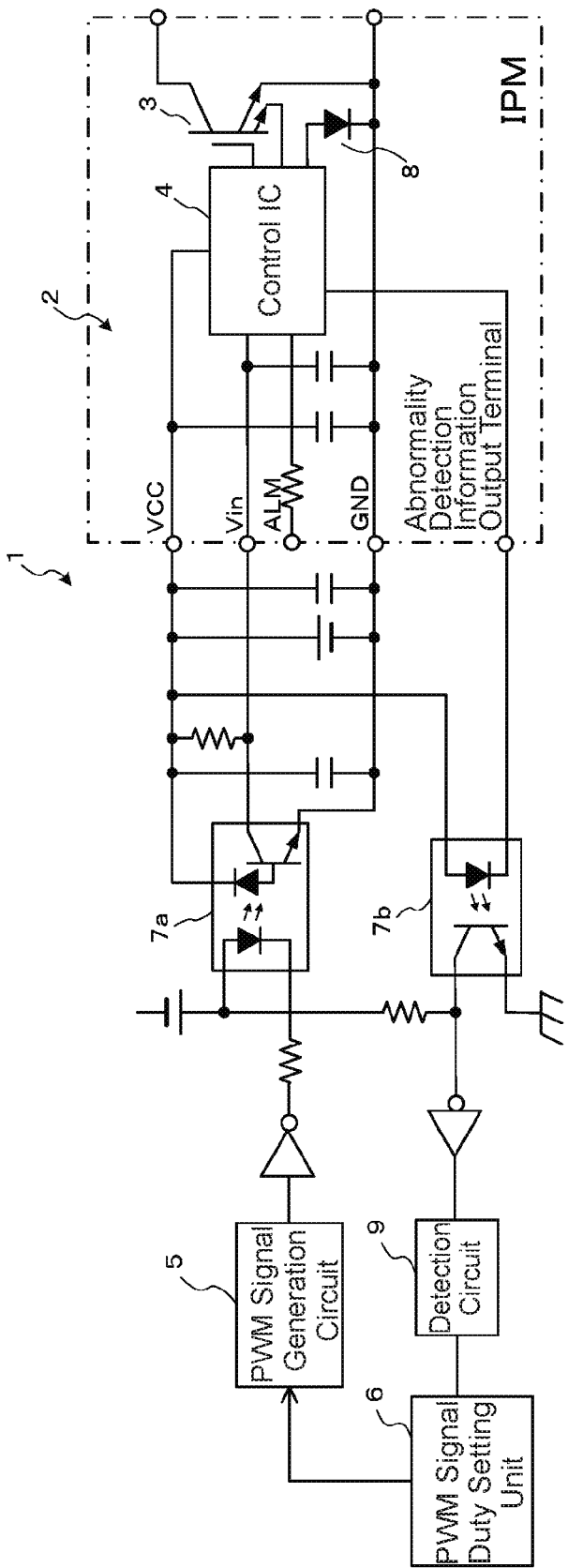
FIG. 4 is a view of a schematic configuration of the main part of a power conversion device constituted by an IPM.

FIGS. 3A to 3D schematically show the generation process of the drive information by the pulse width generation circuit 23 configured as described above. For example, when the IGBT 3 is driven ON/OFF at 100% drive capability, the logic circuit 12 outputs a signal voltage Va shown in FIG. 3A to cause the switching device 14a to turn ON. As shown in FIG. 3B, this selectively outputs a voltage signal of voltage level Vref1 divided by the resistor voltage dividing circuit 13. This voltage signal of voltage level Vref1 drives the IGBT drive circuit 15.

If the chip temperature increases under this drive operation condition of the IGBT 3, the logic circuit 12 outputs a signal voltage Vb shown in FIG. 3A to turn the switching device 14b ON. As shown in FIG. 3B, this selectively outputs a voltage signal of voltage level Vref2 (<Vref1) divided by the resistor voltage dividing circuit 13. The voltage signal of the voltage level Vref2 drives the IGBT drive circuit 15, and the IGBT 3 is driven ON/OFF at 75% drive capability, for example.

If the chip temperature continues to increase even when the drive capability of the IGBT 3 has been reduced as described above, then the logic circuit 12 outputs a signal voltage Vc shown in FIG. 3A to turn ON the switching device 14c. As shown in FIG. 3B, this selectively outputs a voltage signal of voltage level Vref3 (<Vref2<Vref1) divided by the resistor voltage dividing circuit 13. The voltage signal of the voltage level Vref3 drives the IGBT drive circuit 15, and the IGBT 3 is driven ON/OFF at 50% drive capability, for example.

If signals of differing voltage levels as shown in FIG. 3C, for example, are output to outside as the drive information of the IGBT 3 on the basis of the voltage signals having differing voltage levels Vref1, Vref2, or Vref3 that is selected as described above, then it will be possible to ascertain the drive capability of the IGBT 3 set under control of the logic circuit 12 from the voltage level. Such an embodiment is also possible by using an appropriately designed circuit. In this embodiment, however, to further enhance the reliability and convenience of such detection, the pulse width generation circuit 23 produces a pulse train signal with the pulse period and the pulse height both of which are determined in accordance with the drive capability of the IGBT 3 that was set internally so that the external host device, which receives the drive information output signal DOUT, can ascertain the driving capacity of IGBT 3 by referring to both or either of the pulse period and the pulse height of the drive information output signal DOUT that results from the pulse train signal GOUT.

In the pulse width generation circuit 23, currents i1, i2, and i3 respectively predetermined by the respective p-type FETs 34, 35, and 36 are generated by receiving the drive signal (PWM signal) Vref via the AND circuit 22 and driving the second current mirror circuit 25 via the first current mirror circuit 24. Moreover, the pulse width generation circuit 23 receives one of the voltage signals of the voltage levels Vref1, Vref2, and Vref3 which is switched and selectively output in the above-described manner, and the voltage signal is provided to the n-type FETs 37, 38, and 39 serving as switches.

This results in the capacitor 26 being charged by the current i1 output from the p-type FET 34 when the voltage level Vref1 is output. The capacitor 26 is also charged by the current i2 (<i1) output from the p-type FET 35 when the voltage level Vref2 is output. In addition, the capacitor 26 is charged by the current i3 (<i2<i1) output from the p-type FET 36 when the voltage level Vref3 is output. When the charging voltage of the capacitor 26 exceeds the reference voltage Vth, the n-type FET 40 is driven ON in accordance with the inversion of the output of the comparator 28, and thus the charge in the capacitor 26 is discharged.

Accordingly, when the capacitor 26 has been rapidly charged with the current i1 output from the p-type FET 34, the charging period of the capacitor 26 becomes shorter, as shown in FIG. 3D, for example. In such a case, the discharge period of the capacitor 26 is determined by the ON resistance of the n-type FET 40, and thus the charging/discharging period of the capacitor 26 also becomes shorter. When the capacitor 26 is charged with the current i2 (<i1) output from the p-type FET 35, as shown in FIG. 3D, the charging period of the capacitor 26 is longer than when the capacitor 26 is charged with the current i1, and thus the charging/discharging period thereof also becomes longer. When the capacitor 26 is charged with the current i3 (<i2) output from the p-type FET 36, the charging period of the capacitor 26 becomes even longer as shown in FIG. 3D, and thus the charging/discharging period of the capacitor 26 becomes even longer due to this.

This way drive information is generated in accordance with the pulse signal generated in the pulse width generation circuit 23. Thus, it is possible to ascertain the operation state of the IGBT 3, or namely, the drive capability of the IGBT 3 that has been modified in accordance with the chip temperature, on the basis of the period of the pulse signal, for example, and in particular, on the basis of change in pulse width at the L level of the pulse signal.

Then, a pulse signal corresponding to the aforementioned voltage level Vref1, Vref2, or Vref3 is generated as the drive information output signal on the basis of the pulse train signal output GOUT from the pulse width generation circuit 23. This way, it is possible to accurately ascertain the drive capability of the IGBT 3 that has been modified in accordance with the chip temperature on the basis of the differences in the voltage level and in the pulse width of the pulse signal of the drive information output signal. Embodiments can be configured such that the pulse period of the resulting drive information output signal DOUT be indicative of the drive capability of the IGBT 3, or alternatively, the product of the pulse width and the voltage level of the resulting drive information output signal DOUT may be set to indicate the drive capability of the IGBT 3. If such a drive information output signal DOUT is generated, it will be possible to accurately ascertain, by an external device, the drive capability of the IGBT 3 that has been controlled to be modified in accordance with the chip temperature.

In regard to the generation of the drive information output signal described above, it is sufficient to generate a signal of a voltage level corresponding to the aforementioned voltage level Vref1, Vref2, or Vref3, and then to modulate and convert the voltage signal to a pulse on the basis of a pulse signal output from the pulse width generation circuit 23. In regard to the pulse width of the pulse signal generated by the pulse width generation circuit 23, it is sufficient for the currents i1, i2, i3 respectively output from the p-type FETs 34, 35, 36 in accordance with the drive capability of the IGBT 3 to be set based on the capacitance of the capacitor 26.

The present invention is not limited to the embodiments above. An example was described in which the drive capability of the IGBT 3 is switched among three stages, but it is also possible to switch among four stages or more. In the embodiment, an example was described in which positive pulse signals referenced to 0V are generated as drive signals (PWM signals) having differing voltage levels, but it is also possible that negative pulse signals referenced to a prescribed power supply voltage VCC be generated as drive signals (PWM signals) having differing voltages. The drive information output signal that is externally output may also be generated in reference to the prescribed power supply voltage VCC.

In the example described above, the charging current for the capacitor 26 was selectively generated as one of currents i1, i2, and i3 in accordance with the voltage levels Vref1, Vref2, and Vref3 in the second current mirror circuit 25. It is also possible that currents i respectively supplied from a plurality of current sources are selectively added together in accordance with the voltage levels Vref1, Vref2, and Vref3 to respectively generate the currents i1, i2, and i3 as the charging current for the capacitor 26. Various modifications can be made without departing from the spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A drive device for a semiconductor element, comprising:
    a drive circuit receiving from outside a pulsed drive signal for driving ON/OFF of the semiconductor element; and
    a protection circuit receiving a signal representing a chip temperature of the semiconductor element and, when the detected chip temperature exceeds an overheating threshold temperature, adjusting a drive control voltage that is provided to the semiconductor element so as to control operation of the drive circuit; and
    a drive information output circuit externally outputting drive information in accordance with the adjusted drive control voltage that is provided to the semiconductor element by the drive circuit,
    wherein the semiconductor element is an IGBT, and the adjustment of the drive control voltage of the semiconductor element is performed by switching a voltage provided to the drive circuit in accordance with the detected chip temperature of the IGBT.

2. The drive device for the semiconductor element according to claim 1, wherein the drive information output circuit outputs the drive information in the form of a pulse train signal that has a pulse height and a pulse period both of which are determined in accordance with the adjusted drive control voltage.

3. The drive device for the semiconductor element according to claim 1, wherein the drive information output circuit generates, as the drive information, a pulse train signal such that a product of a pulse height of the pulse train signal and a pulse period of the pulse train signal indicates a drive capability of the semiconductor element.

4. The drive device for the semiconductor element according to claim 1, further comprising a display unit that indicates the adjustment of the drive control voltage.

5. A drive device for a semiconductor element, comprising:
    a drive circuit receiving from outside a pulsed drive signal for driving ON/OFF of the semiconductor element; and
    a protection circuit receiving a signal representing a chip temperature of the semiconductor element and, when the detected chip temperature exceeds an overheating threshold temperature, adjusting a drive control voltage that is provided to the semiconductor element so as to control operation of the drive circuit; and
    a drive information output circuit externally outputting drive information in accordance with the adjusted drive control voltage that is provided to the semiconductor element by the drive circuit,
    wherein the drive information output circuit outputs the drive information in the form of a pulse train signal that has a pulse height and a pulse period both of which are determined in accordance with the adjusted drive control voltage.

6. The drive device for the semiconductor element according to claim 5, wherein the drive information output circuit generates, as the drive information, a pulse train signal such that a product of a pulse height of the pulse train signal and a pulse period of the pulse train signal indicates a drive capability of the semiconductor element.

7. A drive device for a semiconductor element, comprising:
    a drive circuit receiving from outside a pulsed drive signal for driving ON/OFF of the semiconductor element; and
    a protection circuit receiving a signal representing a chip temperature of the semiconductor element and, when the detected chip temperature exceeds an overheating threshold temperature, adjusting a drive control voltage that is provided to the semiconductor element so as to control operation of the drive circuit; and
    a drive information output circuit externally outputting drive information in accordance with the adjusted drive control voltage that is provided to the semiconductor element by the drive circuit,
    wherein the drive information output circuit generates, as the drive information, a pulse train signal such that a product of a pulse height of the pulse train signal and a pulse period of the pulse train signal indicates a drive capability of the semiconductor element.

* * * * *